US009304159B2

(12) United States Patent
Zhou et al.

(10) Patent No.: US 9,304,159 B2
(45) Date of Patent: Apr. 5, 2016

(54) DETECTION AND LOCATION OF ELECTRICAL CONNECTIONS HAVING A MICRO-INTERFACE ABNORMALITY IN AN ELECTRICAL SYSTEM

(71) Applicant: EATON CORPORATION, Cleveland, OH (US)

(72) Inventors: Xin Zhou, Franklin Park, PA (US); Michael Dadian, Fletcher, NC (US); Dale Gass, Brown Deer, WI (US); Mark Gould, North Huntingdon, PA (US); Edgar Perez Flores, Moon Township, PA (US); Timothy Thompson, Pittsburgh, PA (US)

(73) Assignee: EATON CORPORATION, Cleveland, OH (US)

( * ) Notice: Subject to any disclaimer, the term of this patent is extended or adjusted under 35 U.S.C. 154(b) by 421 days.

(21) Appl. No.: 13/736,214

(22) Filed: Jan. 8, 2013

(65) Prior Publication Data
US 2014/0191767 A1  Jul. 10, 2014

(51) Int. Cl.
*G01R 31/04* (2006.01)
*G01R 27/00* (2006.01)
(Continued)

(52) U.S. Cl.
CPC ............... *G01R 31/04* (2013.01); *G01R 27/00* (2013.01); *G01R 31/3274* (2013.01);
(Continued)

(58) Field of Classification Search
CPC .......... G01R 1/00; G01R 17/00; G01R 19/00; G01R 21/00; G01R 22/00; G01R 23/00; G01R 25/00; G01R 27/00; G01R 29/00; G01R 31/00; G01R 31/003; G01R 31/02; G01R 31/08; G01R 31/12; G01R 31/1209
USPC ......................................................... 324/538
See application file for complete search history.

(56) References Cited

U.S. PATENT DOCUMENTS 3,612,992 A   10/1971   Cronin
3,622,872 A   11/1971   Boaz
(Continued)

FOREIGN PATENT DOCUMENTS

DE   197 19 478 A1   5/1997
EP   2 442 121 A2    4/2012
EP   2 442 122 A2    4/2012

OTHER PUBLICATIONS

Megger Test Equipment Depot, "A Guide to Low Resistance Testing" URL:http://www.testequipmentdepot.com, Mar. 31, 2004, pp. 1-34, Melrose.

(Continued)

*Primary Examiner* — Huy Q Phan
*Assistant Examiner* — Temilade Rhodes-Vivour
(74) *Attorney, Agent, or Firm* — Eckert Seamans Cherin & Mellott, LLC; Philip E. Levy; Grant E. Coffield (57) ABSTRACT

A method of detecting and locating a micro-interface abnormality within an electrical system having a plurality of conductors and a plurality of electrical connections includes identifying a subset of the plurality of electrical connections by detecting an acoustic signal within the electrical system and analyzing the detected acoustic signal and determining that the detected acoustic signal is indicative of an electrical fault, measuring a contact resistance of each of the subset of the plurality of electrical connections, and identifying at least one of the subset of the plurality of electrical connection points as having a micro-interface abnormality based on the measured contact resistances.

8 Claims, 5 Drawing Sheets

(51) Int. Cl.
    *G01R 31/327*    (2006.01)
    *G01R 31/12*     (2006.01)
    *G01R 31/00*     (2006.01)
    *G01R 31/08*     (2006.01)

(52) U.S. Cl.
    CPC ........... *G01R 31/3275* (2013.01); *G01R 31/00* (2013.01); *G01R 31/08* (2013.01); *G01R 31/12* (2013.01); *G01R 31/1209* (2013.01)

(56) References Cited

U.S. PATENT DOCUMENTS

| | | | |
|---|---|---|---|
| 4,158,169 | A | 6/1979 | Harrold et al. |
| 5,220,484 | A | 6/1993 | Seri |
| 6,361,375 | B1 | 3/2002 | Sinclair |
| 7,148,696 | B2 | 12/2006 | Zhou et al. |
| 7,450,369 | B2 | 11/2008 | Wilkie, II et al. |
| 8,068,320 | B2 | 11/2011 | Faulkner et al. |
| 2003/0201780 | A1* | 10/2003 | Blades ............ 324/523 |
| 2006/0164097 | A1* | 7/2006 | Zhou et al. ........... 324/529 |
| 2006/0254355 | A1* | 11/2006 | Zhou ............ G01R 31/026 73/579 |
| 2007/0263329 | A1 | 11/2007 | Zhou et al. |
| 2008/0054917 | A1* | 3/2008 | Henson ........... G01R 31/2889 324/754.03 |
| 2012/0095706 | A1* | 4/2012 | Zhou et al. .............. 702/58 |
| 2012/0256754 | A1* | 10/2012 | Hoeft et al. ............. 340/650 |
| 2012/0294043 | A1* | 11/2012 | Juds ............... H02M 3/156 363/15 |

OTHER PUBLICATIONS

M. Runde T. Aurud L.E. Lundgaard et al., "Acoustic Diagnosis of High Voltage Circuit-Breakers", IEEE Transactions on Power Delivery, Jul. 1992, pp. 1306-1315. vol. 7, No. 3, New York.

International Search Authority, International Search Report and Written Opinion for International Application No. PCT/US2013/068430, mailed Feb. 25, 2014.

Wojciech Sikorski and Waldemar Ziomek, "Detection, Recognition and Location of Partial Discharge Sources Using Acoustic Emission Method", Mar. 2, 2012, pp. 1-27, In Tech, www.intechopen.

Sacha M. Markalous, Stefan Tenbohlen and Kurt Feser, "Detection and Location of Partial Discharges in Power Transformers Using Acoustic and Electromagnetic Signals", Apr. 2008, pp. 1-9.

\* cited by examiner

DETECTION AND LOCATION OF ELECTRICAL CONNECTIONS HAVING A MICRO-INTERFACE ABNORMALITY IN AN ELECTRICAL SYSTEM

BACKGROUND

1. Field

The disclosed concept relates generally to electrical systems, and, in particular, to a method for detecting and locating within an electrical system electrical connections that have a micro-interface abnormality.

2. Background Information

There is no known cost effective technology and/or product for monitoring, detecting and locating electrical connections that have a micro-interface abnormality due to a faulty electrical connection such as, without limitation, a loose connection in an electrical system, such as, without limitation, a low voltage or medium voltage switchgear or an uninterruptable power supply (UPS). In one current methodology, each electrical joint or connection is monitored by an dedicated/associated sensor, such as a thermocouple, to detect fault conditions, such as overheating. This methodology has not been widely adopted due to the high relative cost of providing a dedicated sensor for each electrical connection within the electrical system. Another current methodology uses infrared scanning/imaging to find loose electrical connections, but this methodology does not provide continuous (e.g., "24-7" or 24 hours a day, seven days a week) detection and monitoring, is limited to inspection of only exposed joints, and exposes operators to arc flash hazards when opening energized enclosures. Furthermore, both of these known methods detect micro-interface abnormalities at a relatively late stage when the bulk temperature at the electrical joint is much higher than its allowed working temperature. In reality, however, micro-interface abnormalities in electrical connections usually start long before the bulk temperature at the electrical joint reaches an abnormal level.

SUMMARY

These needs and others are met by embodiments of the disclosed concept, which are directed to a method of detecting and locating a micro-interface abnormality within an electrical system having a plurality of conductors and a plurality of electrical connections. The method includes identifying a subset of the plurality of electrical connections by detecting an acoustic signal within the electrical system and analyzing the detected acoustic signal and determining that the detected acoustic signal is indicative of an electrical fault, measuring a contact resistance of each of the subset of the plurality of electrical connections, and identifying at least one of the subset of the plurality of electrical connections as having a micro-interface abnormality based on the measured contact resistances.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

Directional phrases used herein, such as, for example, left, right, front, back, top, bottom and derivatives thereof, relate to the orientation of the elements shown in the drawings and are not limiting upon the claims unless expressly recited therein.

As employed herein, the statement that two or more parts are "coupled" together shall mean that the parts are joined together either directly or joined through one or more intermediate parts.

As employed herein, the term "number" shall mean one or an integer greater than one (i.e., a plurality).

As employed herein, the term "electrical connection" shall mean any point in an electrical system where at least two separate electrical conductors are electrically joined to one another for purposes of making an operative electrical coupling between the conductors. The term "electrical joint" may also be used to refer to an "electrical connection."

As employed herein, the term "micro-interface abnormality" in the context of an electrical connection shall mean that the electrical connection has a high (e.g., 40 $\mu\Omega$ or greater) electrical contact interface resistance due to, for example and without limitation, erosion, corrosion, oxidation, or loss of contact force at the electrical connection, which typically leads to overheating of the electrical connection. The term "micro-interface" is used because the real electrical conducting path at the contact interface is usually very small compared to the physical surface of the contact interface.

Figure 1:
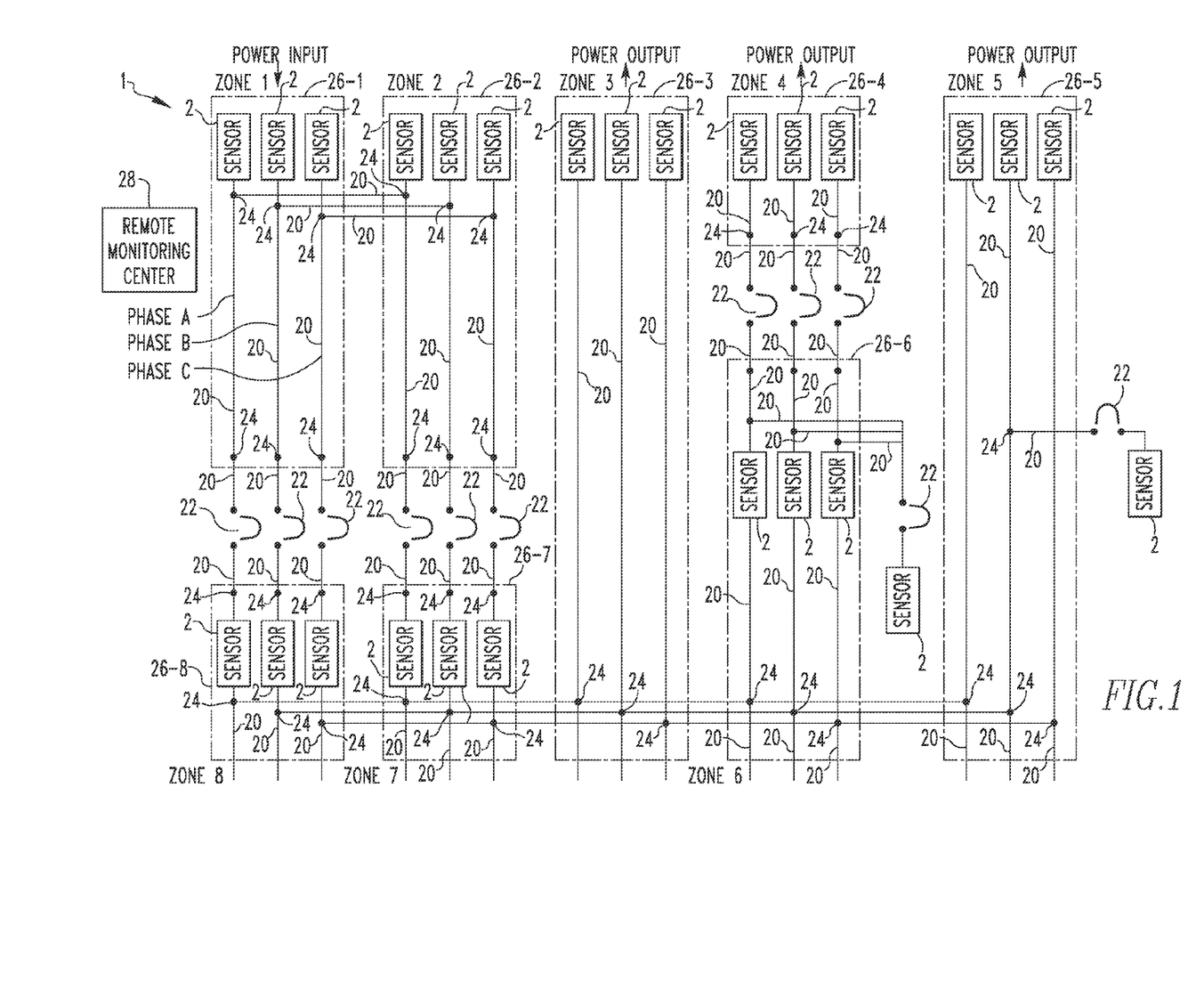
FIG. 1 is a schematic diagram of an electrical system in which the method of detecting and locating electrical connections that have a micro-interface abnormality according to the present invention may be implemented.

FIG. 1 is a schematic diagram of an exemplary electrical system in which the method of detecting and locating electrical connections that have a micro-interface abnormality according to the present invention may be implemented. In the illustrated, exemplary embodiment, the electrical system is in the form of a low voltage switchgear 1. It will be understood, however, that this is meant to be exemplary only, and that the present invention may be implemented in connection with any of a number of different types of electrical distribution systems that include a number of electrical connections therein, including, without limitation, a medium voltage switchgear or an uninterruptable power supply (UPS), among others.

As is known in the art, a switchgear, such as switchgear 1, is an electrical system that includes an integrated assembly of electrical disconnect switches, circuit breakers, busbar conductors, buses (i.e. power supply rails), fuses and/or other components that are used to control, protect and isolate electrical equipment at an electrical installation, such as an electrical power substation. A switchgear is used to both de-energize equipment to allow work to be done and to clear electrical faults downstream of the switchgear. A switchgear is often housed in a metal cabinet at the installation.

In the illustrated exemplary embodiment, switchgear 1 is structured for use in a three phase electrical system, labeled phases A, B and C in FIG. 1. Switchgear 1 also includes a number of electrical conductors each labeled 20 in FIG. 1, a number of circuit breakers each labeled 22 in FIG. 1, and a number of electrical connections each labeled 24 in FIG. 1 (each electrical connection 24 being between two or more of the conductors 20).

Furthermore, as seen in FIG. 1, switchgear 1 is divided into a number of individual zones 26, wherein in the exemplary embodiment each zone 26 includes for each phase of the system: (i) one acoustic sensor apparatus 2, described in detail elsewhere herein (thus, in the three phase system of FIG. 1, each zone 26 has three acoustic sensor apparatuses 2), (ii) a number of the conductors 20, and (iii) a number of the electrical connections 24. In the illustrated embodiment, switchgear 1 includes eight such zones, labeled "Zone 1" through "Zone 8" and 26-1 through 26-8 in FIG. 1.

As described in greater detail herein, each of the acoustic sensors apparatuses 2 is structured to detect an acoustic signal within switchgear 1, and analyze the detected acoustic signal to determine whether the acoustic signal is indicative of an electrical fault, such as an overheated electrical joint and/or partial discharge within switchgear 1. Each of the acoustic sensors apparatuses 2 is in wired or wireless electronic communication with a computerized remote monitoring center 28, and the acoustic sensors apparatuses 2 are each structured to output information to remote monitoring center 28 that is indicative of the electrical fault state in the associated zone 26 of switchgear 1. Remote monitoring center 28 may be any type of computing system capable of receiving and processing the signals described herein, and may, in one non-limiting exemplary embodiment, comprise a trip unit of one of the circuit breakers 22, or, alternatively, a computer system (including a PC and/or server computer) associated with switchgear 1. In the exemplary embodiment, each acoustic sensor apparatus 2 senses any acoustic signals that propagate through conductors 20 of switchgear 1, and analyzes each acoustic signal using an event time correlation (ETC) algorithm to determine whether the acoustic signal is induced by an electrical fault (such as an overheated joint or partial discharge). As used herein, an "event time correlation (ETC) algorithm" shall refer to a detection method based on acoustic wavelet profile(s) and the correlation between the wavelet frequency and the electrical power frequency. Responsive to the detection of an electrical fault, the acoustic sensor apparatus 2 will send out a message to remote monitoring center 28 (either via wired or wireless (e.g., RF) communication) that, in the exemplary embodiment, indicates: (i) electrical fault detected, and (ii) sensor ID (and thus the identification of the particular zone 26 experiencing the electrical fault). In another particular embodiment, the message further indicate the acoustic signal intensity (or peak value), and/or the time of the acoustic peak value detected.

Figure 2:
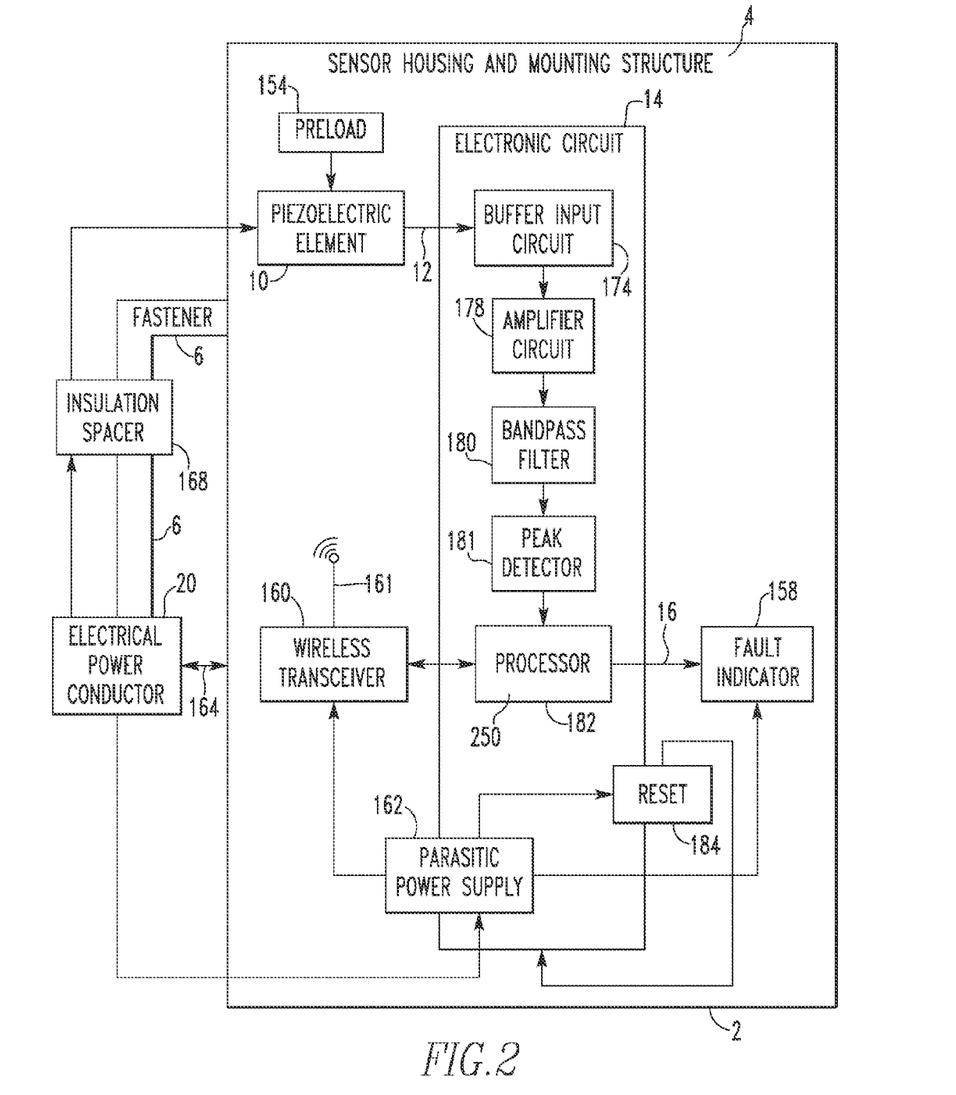
FIG. 2 is a schematic diagram of an acoustic sensor apparatus according to one exemplary, non-limiting particular embodiment.

FIG. 2 is a schematic diagram of acoustic sensor apparatus 2 according to one exemplary, non-limiting particular embodiment. Acoustic sensor apparatus 2 shown in FIG. 3 is also described in detail in U.S. Patent Application Publication No. 2012/0095706, which is owned by the assignee hereof and which is incorporated herein by reference in its entirely. Referring to FIG. 2, acoustic sensor apparatus 2 includes a housing, such as an example sensor housing and mounting structure 4, a fastener 6 structured to fasten together at least the housing 4 and the conductor 20 to which acoustic sensor apparatus 2 is operatively coupled, an acoustic sensor, such as the example piezoelectric element 10, structured to detect an acoustic signal from switchgear 1 and output a signal 12, and a circuit, such as an example electronic circuit 14, structured to detect an electrical fault 16 from the signal 12.

The example acoustic sensor apparatus 2 includes the example sensor housing and mounting structure 4, the fastener 6, the example piezoelectric element 10, an optional preload 154, the example electronic circuit 14 that outputs the electrical fault signal 16, an electrical fault indicator 158, a communication device, such as a wired transceiver, a wired transmitter, a wireless transmitter, or a wireless transceiver 160 including an antenna 161, and a power supply 162.

The preload 154, which is not required, compresses the piezoelectric element 10 under pressure in its assembly. The "preload" means that the piezoelectric element 10 is compressed or under pressure in its assembly. The preload 154, which is applied to the example piezoelectric element 10, can be, for example and without limitation, a compression element such as a loaded compression spring.

The sensor housing and mounting structure 4 is suitably fastened, at 164, to the associated conductor 20 of switchgear 1 by a suitable insulation spacer 168 or through the sensor housing by a suitable insulating spacer (not shown).

Although the power supply 162 is shown as being an example parasitic power supply (e.g., without limitation, employing a current transformer (CT) (not shown) that derives power from switchgear, it will be appreciated that a wide range of power supplies, such as external power or batteries, can also be employed.

The wireless transceiver 160 provides a suitable wireless communication capability (e.g., without limitation, IEEE 802.11; IEEE 802.15.4; or another suitable wireless transceiver or transmitter) to communicate the detection of an electrical fault to another location (e.g., without limitation, to remote monitoring center 28) to alert maintenance personnel of the electrical fault and its zone location within switchgear 1.

As seen in FIG. 2, the exemplary electronic circuit 14 includes a buffer input circuit 174 that receives the output signal 12 (e.g., an acoustic signal) from the piezoelectric element 10, an amplifier circuit 178, a bandpass filter 180, a peak detector 181 and a processor 182. A reset circuit 184 can reset the electronic circuit 14 after a power outage caused by the parasitic power supply 162 receiving insufficient power.

The piezoelectric element 10 senses acoustic signals propagating through the associated conductor 20, and outputs the signal 12 to the buffer input circuit 174, which outputs a voltage signal to the amplifier circuit 178. The voltage signal is amplified by the amplifier circuit 178 that outputs a second signal. The second signal can be filtered by the bandpass filter 180 and input by the peak detector 181 that detects a peak signal and outputs that as a third signal. The third signal is analyzed by a routine 250 of the processor 182, in order to detect the electrical fault therefrom. This determines if an electrical fault, such as overheated electrical joints and/or partial discharge, exists within switchgear 1. As noted elsewhere herein, routine 250 of the processor 182 analyzes the acoustic signal using the event time correlation (ETC) algorithm to determine whether the acoustic signal is induced by an electrical fault instead of other phenomena or activities.

Figure 3A:
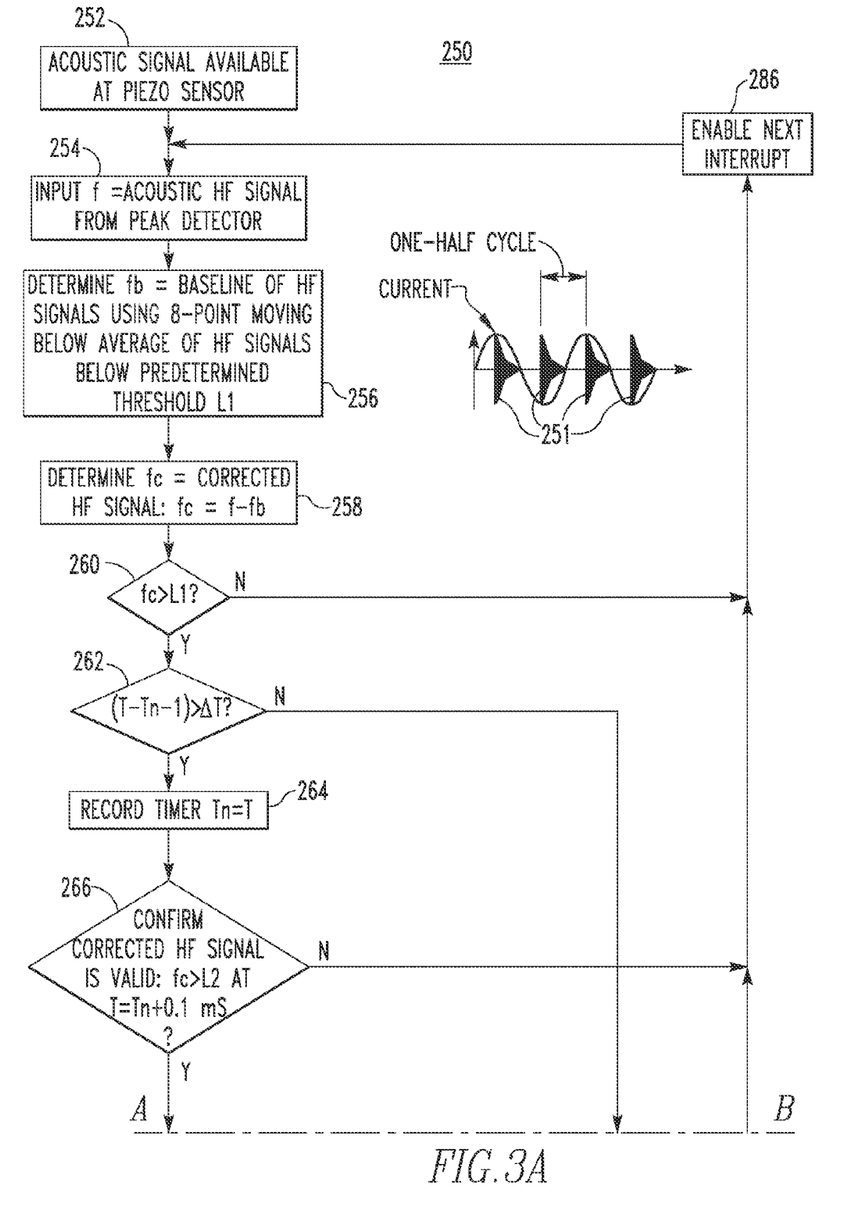
FIGS. 3A-3B are flowcharts illustrating a routine for detecting faults from detected acoustic signals using an event time correlation (ETC) algorithm according to one exemplary embodiment of the present invention that may be implemented in the electrical system of FIG. 1.
Figure 3B:
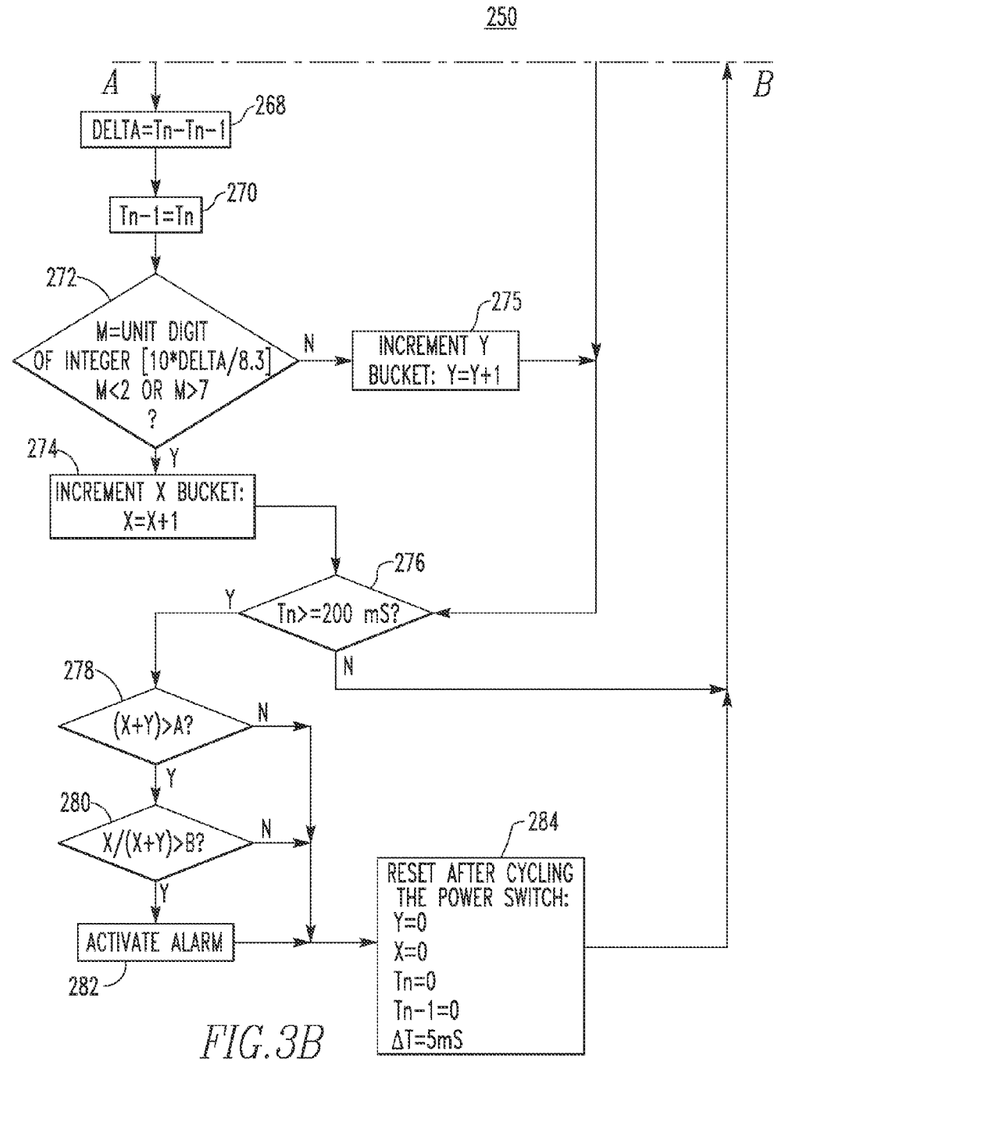

Referring to FIGS. 3A-3B, the routine 250 for processor 182 using the event time correlation (ETC) algorithm according to one exemplary embodiment of the present invention is shown. The general operation of this routine 250 is to obtain output from the peak detector 181 of FIG. 2 and measure DELTA (step 268), the time difference between two adjacent signals from the peak detector 181. The determination of whether an electrical fault exists within switchgear 1 is based on this determined/measured DELTA as well as the acoustic wavelet profile.

First, at 252, an acoustic signal is available at the piezoelectric element 10 and the peak acoustic signal therefrom is available at the peak detector 181. Next, at 254, the routine 250 inputs a signal, f, which is the acoustic high frequency (HF) signal from the peak detector 181.

Then, at 256, a value, fb, is determined, which is the baseline of the HF signals using, for example, an 8-point moving average of the HF signals below a predetermined threshold L1. Two L1 and L2 thresholds are employed by the routine 250 to confirm that acoustic wavelets 251 have the intended profile representative of an electrical fault within switchgear 1. Non-limiting examples of L1 and L2 are 100 mV and 50 mV, respectively. Sometimes, the HF signal from the peak detector 181 has a relatively high noise level due to various reasons such as, for example, increased EMI noise. In order to avoid the effect of baseline noise level variation, step 256 seeks to take the noise level out of the measured signal by estimating the noise level using the example 8-point moving average on those HF signals below the predetermined threshold L1. The example 8-point moving average is the average value of the last example eight samples whose values are below the L1 threshold. Next, at 258, the corrected HF signal, fc, is determined from f-fb.

At 260, it is determined if fc is greater than L1. If so, then it is determined if T−Tn−1 is greater than ΔT (e.g., a predefined value such as 5 mS) at 262. T is the time from a suitable timer (not shown) (e.g., without limitation, an oscillator circuit (not shown) in the processor 182 of FIG. 2; a crystal oscillator (not shown) in the processor 182). DELTA is reset to zero at 284 (where Tn=Tn−1=0) after the routine 250 reaches its predetermined time period at 276. If the test passes at 262, then at 264, the timer value, T, is recorded as Tn. Tn=T means that time T is recorded as Tn when there is an acoustic signal coming out of the peak detector 181 that is higher than the L1 threshold. Next, step 266 confirms that the corrected HF signal is valid if fc is greater than L2 at T=Tn+0.1 mS. If so, then variable DELTA is set equal to Tn−Tn−1. Then, at 270, Tn−1 is set equal to Tn.

Next, at 272, it is determined if M is less than 2 or greater than 7, where M is the unit digit of integer [10*DELTA/[1/(2*line frequency)], e.g., without limitation, 1/(2*line frequency)≈8.3333 mS for a 60 Hz power system]. This checks if DELTA is a multiple of 1/(2*line frequency)mS (e.g., without limitation, DELTA/8.3333=2.1, then (DELTA/8.3333)×10=21, and M=1 which is less than 2. So DELTA in this case can be considered as a multiple of 8.3333 mS considering the potential measurement error.) Effectively, step 272 determines if DELTA is a multiple of one-half line cycle (e.g., without limitation, about 8.3333 mS). M represents the digit after the digit point, such as, for example, M=2 for 3.24 or M=8 for 5.82. If the test passes at 272 and DELTA is a multiple of one-half line cycle, then, at 274, one is added to an X bucket. On the other hand, if DELTA is not a multiple of one-half line cycle, then, at 275, one is added to a Y bucket. After steps 274 or 275, or if the test failed at 262, then at 276, it is determined if Tn is greater than or equal to a predetermined time (e.g., without limitation, 200 mS; 2 S; 10 S; one day). If so, then at 278 and 280, the routine 250 checks two criteria before it declares that the noise is induced by an electrical fault, such as an overheated electrical joint or partial discharge. Step 278 checks if X+Y>=A (e.g., without limitation, 10; 15; any suitable value); and step 280 checks if the ratio of X/(X+Y)>B (e.g., without limitation, 60%; any suitable percentage less than 100%). If these two tests pass, then an alarm (e.g., the electrical fault indicator 158 of FIG. 2) is activated at 282. Otherwise, if one or both of these two tests fail, or after 282, the routine 250 causes a reset after cycling of power (e.g., if power from the power supply 162 of FIG. 2 cycles; if a manual power switch (not shown) is cycled), then values Y, X, Tn and Tn−1 are reset to zero and ΔT is set to 5 mS at 284, and the next interrupt is enabled at 286. Step 286 is also executed if any of the tests fail at 260, 266 and/or 276. Interrupts occur periodically (e.g., without limitation, every 100 μS). Also, the X and Y buckets of respective steps 274 and 275 are reset to zero after a predetermined time (e.g., without limitation, 10,000 mS; any suitable time).

Figure 4:
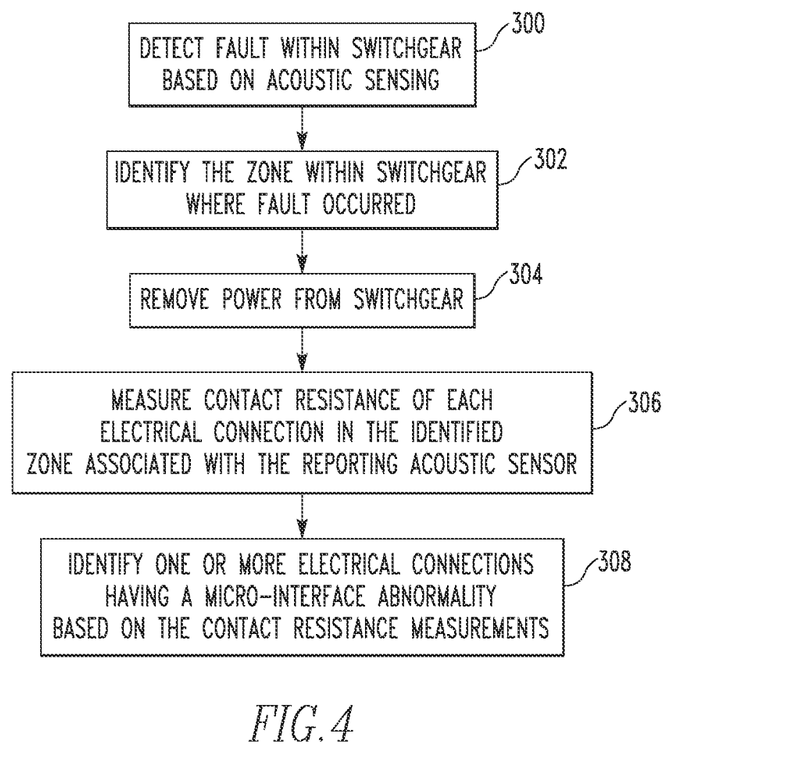
FIG. 4 is a flowchart showing a method for detecting and locating electrical connections within electrical system of FIG. 1 that have a micro-interface abnormality according to an exemplary embodiment of the present invention.

FIG. 4 is a flowchart showing a method for detecting and locating electrical connections 24 within switchgear 1 that have a micro-interface abnormality according to an exemplary embodiment of the present invention. As described in detail below, the method of FIG. 4 employs two stages. In the first stage, the particular zone 26 within switchgear 1 that has experienced an electrical fault condition is identified using the acoustic sensing technology just described. Then, in a second stage, once the particular zone 26 has been identified, the particular electrical connection 24 that has the electrical fault (micro-interface abnormality) is identified and located based on measurements of contact resistance using, for example and without limitation, a suitable piece of measuring equipment such as a micro-Ohm meter.

Referring to FIG. 4, the method begins at step 300, wherein an electrical fault is detected by one of the acoustic sensor apparatuses 2 and is reported to remote monitoring center 28 as described elsewhere herein. Next, at step 302, the particular zone 26 where the electrical fault occurred is identified based on the particular acoustic sensor apparatus 2 that reported the electrical fault. For example, if the acoustic sensor apparatuses 2 that is coupled to the phase A conductor in zone 26-1 reports the electrical fault, then Zone 1 (26-1) will be identified as the zone of interest. Next, at step 304, for safety reasons, power at switchgear 1 is shut down. Then, at step 306, a maintenance worker measures the contact resistance of each of the electrical connections 24 within the identified zone 26 that is associated with the acoustic sensor apparatus 2 reporting the electrical fault using, for example, a micro-Ohm meter. Continuing with the above example in FIG. 1, the worker will test the two electrical connections 24 in zone 26-1 that are associated with the phase A conductors 20 in that zone 26-1. By measuring the contact resistance across selected electrical connections 24, the actual faulty connection (the one having the micro-interface abnormality) can be quickly identified since it will have a higher contact resistance than a normal electrical connection (e.g., 189 micro-ohms as compared to 9 micro-ohms for normal copper conductor connections). Thus, as step 308, one or more of the electrical connections 24 having a micro-interface abnormality are able to be identified based on the contact resistance measurements, and appropriate maintenance steps may then be taken.

Thus, the method of FIG. 4 provides a methodology for detecting and locating micro-interface abnormalities that enables continuous, "24-7" detection and monitoring, is not limited to inspection of only exposed electrical joints, and that protects workers from hazards.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A method of detecting and locating a micro-interface abnormality within an electrical system having a plurality of conductors and a plurality of electrical connections, comprising:

identifying a subset of the plurality of electrical connections by detecting an acoustic signal within the electrical system that is associated with the subset of the plurality of electrical connections and analyzing the detected acoustic signal and determining that the detected acoustic signal is indicative of an electrical fault;

responsive to determining that the detected acoustic signal is indicative of an electrical fault, measuring a contact resistance of each of the subset of the plurality of electrical connections; and identifying at least one of the subset of the plurality of electrical connection points as having a micro-interface abnormality responsive to determining that the measured contact resistance of the at least one of the subset of the plurality of electrical connection points is above a predetermined level.

2. The method according to claim 1, wherein the electrical system is a switchgear, uninterruptable power supply, or a motor control center.

3. The method according to claim 1, wherein the electrical system is divided into plurality of zones, wherein the step of identifying the subset of the plurality of electrical connections comprises identifying a particular one of the zones by detecting an acoustic signal within the particular one of the zones and analyzing the detected acoustic signal and determining that the detected acoustic signal is indicative of an electrical fault, the subset of the plurality of electrical connections being located within the particular one of the zones.

4. The method according to claim 3, further comprising providing at least one an acoustic sensor apparatus in each zone to measure an acoustic signal from one or more of the conductors of the zone, and wherein one of the at least one acoustic sensor apparatuses provided in the particular one of the zones detects the acoustic signal within the particular one of the zones and analyzes the detected acoustic signal and determines that the detected acoustic signal is indicative of an electrical fault.

5. The method according to claim 4, further comprising sending a message from the one of the at least one acoustic sensor apparatuses provided in the particular one of the zones to a remote monitoring sensor indicating that an electrical fault has been detected, wherein the measuring step is performed responsive to receipt of the message.

6. The method according to claim 1, wherein the measuring step is performed manually using a micro-ohm meter.

7. The method according to claim 1, further comprising shutting power to the electrical system down after the step of identifying the subset of the plurality of electrical connections and before the measuring step.

8. The method according to claim 1, wherein the analyzing and determining step includes detecting a number of peak signals based on the detected acoustic signal and determining that the detected acoustic signal is indicative of the electrical fault based on a time difference between adjacent ones of the peak signals and an acoustic noise wavelet profile of the detected acoustic signal.

* * * * *